May 3, 1966 G. C. STOLL 3,248,777

METHOD OF PREPARING THERMOELECTRIC MODULES

Filed May 29, 1961

Inventor.
Gerhard C. Stoll.
By. Hofgren, Brady, Wegner.
Allen & Stellman.
Attorneys.

United States Patent Office 3,248,777
Patented May 3, 1966

3,248,777
METHOD OF PREPARING THERMO-ELECTRIC MODULES

Gerhard C. Stoll, Benton Harbor, Mich., assignor to Whirlpool Corporation, a corporation of Delaware Filed May 29, 1961, Ser. No. 113,232
5 Claims. (Cl. 29—155.5)

This invention relates to a thermoelectric module and to a method of making the same.

The term thermoelectric module is commonly used in the thermoelectric art to designate an assembly of thermoelectric couples in a self-sustaining unit for heat pumping when a direct electric current is passed through the thermoelectric couples in series or for power generation when heat is applied to the couples. In this invention the method of making such a module is greatly simplified and the resulting module is strong and efficient.

One of the features of this invention therefore is to provide an improved method of making thermoelectric modules and the resulting modules in which a portion of the module is used not only as a mold for shaping the thermoelectric elements but also to support the elements.

Other features of the invention will be apparent from the following description of an embodiment thereof as disclosed in the accompanying drawings. Of the drawings.

Figure 1:
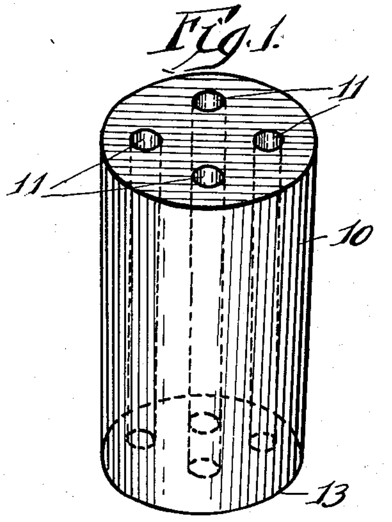
FIGURE 1 is a perspective view of a mass of thermal and electrical insulating heat resistant material having four adjacent openings extending from the top surface to just short of the bottom surface.
Figure 2:
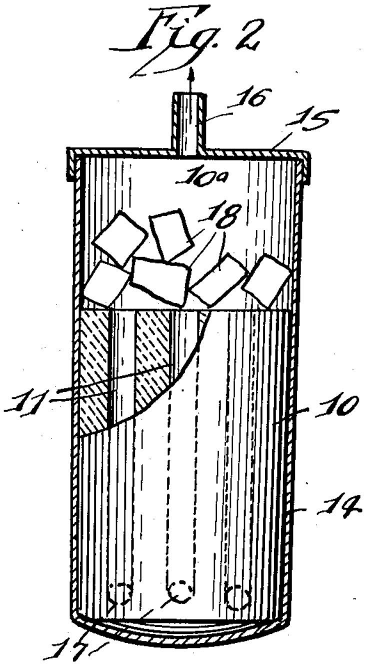
FIGURE 2 is a vertical sectional view through a supporting evacuation cylinder and attached cover showing the cylinder and cover semi-diagrammatically with the insulating material and thermoelectric element materials therein.
Figure 3:
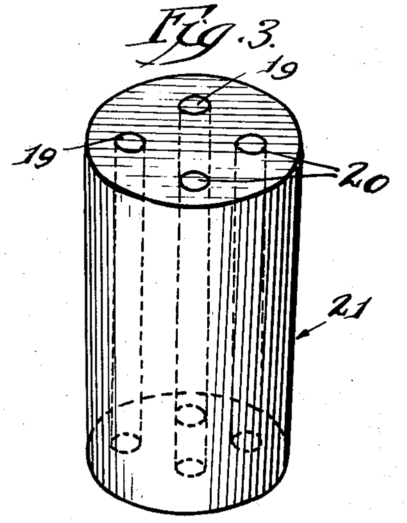
FIGURE 3 is a view similar to FIGURE 1 but showing thermoelectric element materials in place in the openings.
Figure 4:
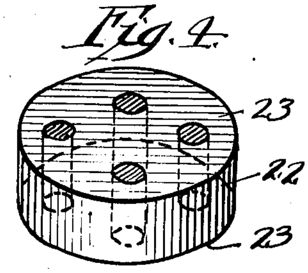
FIGURE 4 is a perspective view of a separated section of the insulating and thermoelectric materials combination of FIGURE 3.
Figure 5:
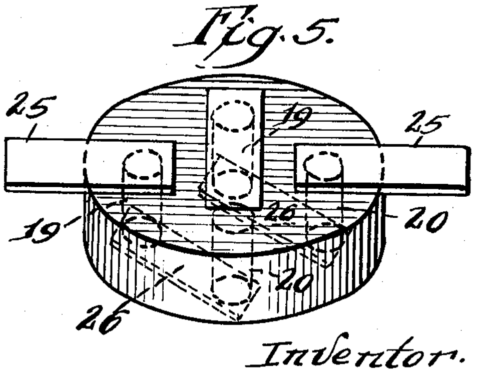
FIGURE 5 is a perspective view of a completed thermoelectric module.

In the customary method of making thermoelectric modules the thermoelectric elements themselves are cast from a molten condition in an elongated mold which may be made of glass, carbon, graphite or the like. Following usual treatment of the elements the mold is broken away and discarded. The elements are then cut into the proper lengths, assembled in a fixture in which the electrical conducting members are attached to the elements to provide an electrical series and then usually rigid insulating material is cast around the elements to provide support as well as insulation. One such material is a foamed-in-place resin such as polystyrene or polyurethane.

The mold of this invention greatly simplifies the method of making the modules and also results in a stronger module that is resistant to breakage and that is also more efficient. In the method of this invention the thermoelectric element materials are cast from a molten condition in a plurality of adjacent openings in a mass of thermal and electrical insulating heat resistant material so that the insulating material not only provides the mold for casting the elements but also becomes a part of the module as it serves to support and insulate the resulting thermoelectric elements.

One method of practicing the invention is exemplified in the accompanying drawings. As shown there, the thermal and electrical insulating heat resistant material 10 is in the shape of a cylinder containing four openings or holes 11 extending from the top end 12 to adjacent the bottom end 13. The cylinder 10 is of a material that will be electrical and thermal insulating and that is resistant to a heat treatment described hereinafter.

The cylinder 10 is placed within a Vycor hollow cylinder 14 provided with an air tight cover 15 having a neck 16 thereon for attachment to evacuation apparatus (not shown). The cylinder 14 is evacuated and the assembly is heated for a period of time sufficient to withdraw entrapped gases from the cylinder 10.

Following the evacuation procedure, the cylinder 14 and its contained insulating material cylinder 10 is permitted to cool to room temperature and opened to ambient atmosphere. The period at which it is opened to the ambient atmosphere is kept as brief as possible. The cover 15 is then removed preparatory to introducing the thermoelectric element material into the openings 11.

Before applying the cover 15 the bottoms of two of the openings 11 are provided with copper bromide as indicated at 17 and on top of the cylinder 10 there are located masses of bismuth-tellurium alloy with the bismuth and tellurium in stoichiometric amounts to produce $Bi_2Te_3$. The amount of alloy is sufficient to fill the openings 11 to just short of the top and the amount of copper bromide is sufficient to form an approximate 0.36 mol percent of copper bromide in the bismuth-tellurium alloy.

With the cover 15 again in air tight sealing position on the cylinder 14 the entire assembly is again evacuated to create a vacuum condition within the space 10*a* of the interior of the cylinder 14. After the evacuation the neck 16 is sealed off and the cylinder 14 and the contents are then placed in a heating apparatus such as a Bridgman type furnace and the temperature of the assembly raised to above the melting points of the bismuth-tellurium masses 18 and the copper bromide 17. Under the influence of this high temperature the masses 18 melt and flow into the openings 11. The quantity of the masses 18 is insufficient to completely fill the openings 11 so that there will be no overflow from one opening 11 to another. The assembly is left in the heating apparatus a sufficient length of time at the melting temperature in order that the copper bromide can diffuse through the molten alloy.

The assembly is then removed from the heating apparatus and permitted to cool to ambient temperature. During the cooling the alloys within the openings 11 solidify. The openings that contain only the bismuth-tellurium alloy constitute P elements 19 while the openings containing the copper bromide become N elements 20.

As soon as the assembly has reached ambient temperature the cover 15 is removed and the assembly 21 of insulating material cylinder 10 containing elongated N and P elements 19 and 20 are cut into a series of transverse sections 22 having parallel top 23 and bottom 24 surfaces at which the ends of the elements are exposed. Junction plates 25 and 26 are then attached to the ends of the elements in order to connect the elements in electrical series in the well known manner. Thus, these elongated plates 25 and 26 may be of any heat conducting material such as copper, nickel and the like and are most conveniently soldered to the ends of the elements.

In one example of practicing the invention the insulating material cylinder 10 is made of slip cast fused silica. This material is ideally fitted for making the cylinder 10 as it has a low coefficient of thermal expansion and is able to withstand considerable thermal shock. Thus, it has a thermal expansion of only $0.54 \times 10^{-6}$ in./° C. and it has a low thermal conductivity of approximately 0.5 B.t.u./hr.-ft.$^2$ ° F./in. It has a low specific gravity of approximately 1.8–2 and does not warp en under severe thermal gradients. It also resists oxition and other chemical change at elevated temperatures d is cellular.

In this one example the cylinder 10 was 1¼ inches diameter and 2 inches tall and contained four holes each 0.285 inch in diameter. These holes may be her cast or drilled but are most conveniently drilled. The amount of copper bromide 17 was sufficient to rm an alloy in the two openings 11 containing the pper bromide of 0.36 mol percent of copper bromide the bismuth-tellurium alloy. As mentioned earlier, e alloy itself was of bismuth and tellurium in stoichioetric proportions to form the compound $Bi_2Te_3$. Such composition melts at 585° C. with the copper bromide elting at 504° C. In the preliminary out-gassing or moval of impurities from the material 10 the cylinder 4 and its contained material 10 was heated and subjected an evacuation pressure of approximately $10^{-4}$ mm. g. This was maintained until substantially all impuries had been removed.

Then, after cooling to room temperature the abovepecified amount of copper bromide was placed in two f the openings 11 and the above-specified proper amount f bismuth-tellurium alloy 18 was placed on top of the naterial 10. After the cover 15 had been sealed in place he cylinder 14 and its contents was again evacuated lown to a pressure of approximately $5\times10^{-5}$ mm. Hg. The neck 16 was sealed off and the assembly was then placed in a Bridgman type furnace and heated until the cylinder 14 and contents achieved a temperature of approximately 700° C. At this temperature all of the naterials 17 and 18 become molten and the masses 18 lowed into the four openings to form the N and P elements as described above. In order to diffuse completely the copper bromide 17 through the alloy in the two openings the assembly was maintained at this elevated temperature for approximately six hours.

Using the Bridgman technique the assembly was then removed from the furnace and cooled to ambient temperature (throughout all this evacuating and heating and cooling the cylinder 10 was maintained in substantially vertical position). As soon as the cylinder 14 and contents had cooled to ambient temperature the cylinder 14 was opened and the assembly 21 removed therefrom. The assembly was then cut into thin wafers or sections 22 which in this embodiment were approximately 0.285 inch thick so that the elements 19 and 20 themselves had this height and this diameter.

Figure 6:
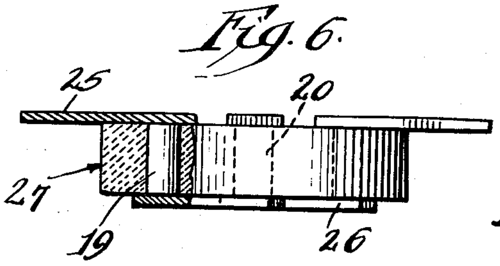
FIGURE 6 is a vertical sectional view through the module of FIGURE 5.

In order to complete the electrical circuit through the elements 19 and 20 so that they were in series, copper strips or plates 25 and 26 were soldered to the ends of the elements as indicated in FIGURE 6. One example of a solder that may be used is 50% bismuth, 47.5% tin and 2.5% antimony, all by weight. As this solder must be heated to 135° C. in order to melt, it is clearly evident that the soldering temperature cannot damage either the elements or the wafers 22.

A very important advantage of this invention is that the section 22 which here is shown as a wafer of thermal and electrical insulating heat resistant material forms not only the supporting part of the thermoelectric assembly 27 but also functions as a part of the cylinder 10 and thus as the shaping mold in which the molten elements themselves are cast. This, of course, greatly simplifies the production of the thermoelectric assembly and results in an extremely strong assembly. This is particularly true where the material 10 is cellular as is true of the slip cast fused silica as the molten materials of the elements penetrate adjacent cells and when the elements are cooled to a solid condition are of course locked in position because of this penetration. Slip cast fused silica is described in the publication Ceramic Age in the issue of August 1960 beginning at page 33 and the issue of September 1960 beginning at page 23.

The invention, however, is not limited to this type of insulating material 10 so long as it is electrical and thermal insulating and so long as it can withstand the temperatures to which it is exposed and is resistant to breakage. The preferred material is an inorganic foamed material preferably a ceramic. Excellent materials have been not only the fused silica grains but also fused alumina, fused magnesia and the like.

Having described by invention as related to the embodiment set out herein, it is my intention that the invention be not limited by any of the details of description, unless otherwise specified, but rather be construed broadly within its spirit and scope as set out in the accompanying claims.

The embodiment of the invention in which an exclusive property or privilege is claimed is defined as follows:

1. A method for the preparation of thermoelectric modules having N and P elements formed from a common source of bismuth-tellurium alloy, which method comprises: providing a solid mass of thermal and electrical insulating material having spaced mold cavities therein; introducing copper bromide into alternate ones of said cavities; melting said copper bromide; introducing molten bismuth-tellumium alloy from a common source into said cavities; maintaining the molten condition of said copper bromide and alloy until said copper bromide is diffused completely through the alloy in the alternate cavities, said insulating material being resistant to the heat of the bismuth-tellurium alloy from a common source into said molten materials; cooling said molten materials to solids to provide an assembly of said solid mass and alternate P and N elements; and exposing end portions of said elements preparatory to connecting said elements in electrical series.

2. The method of claim 1 wherein said exposing of said end portions comprises separating said assembly into a plurality of sections each having opposite sides containing said end portions.

3. In the preparation of thermoelectric modules, the method comprising: providing a solid mass of thermal and electrical insulating material having spaced mold openings therein whose axes are substantially parallel; introducing into alternate separate ones of said openings a solid first meltable material capable of mixing with a second meltable material to form a first thermoelectric element, said second material constituting a second different thermoelectric element; melting a supply of said second material at a temperature above the melting point of both materials and flowing said supply into said mold openings to provide molten first elements in some openings alternating with molten second elements in other openings; and cooling the molten said materials to provide an assembly of said mass and solid alternate thermoelectric elements.

4. The method of claim 3 wherein said assembly is separated into a plurality of sections each having opposite sides bounded by essentially plane surfaces substantially at right angles to said axes with each section containing a plurality of said elements having their ends exposed adjacent said sides.

5. In the preparation of thermoelectric modules, the method comprising: providing a solid mass of thermal and electrical insulating material having spaced mold openings therein whose axes are substantially parallel; introducing into alternate separate ones of said openings a solid first meltable material capable of mixing with a second meltable material to form a first thermoelectric element, said second material constituting a second different thermoelectric element; melting a supply of said second material at a temperature above the melting point of both materials and flowing said supply into said mold openings to provide molten first elements in some openings alternating with molten second elements in other openings; cooling the molten said materials to provide an assembly of said mass and solid alternate thermoelectric elements; and separating said assembly into a plurality of sections each having opposite sides bounded by essentially plane surfaces substantially at right angles to said axes with each section containing a plurality of said elements having their ends exposed adjacent said sides preparatory to connecting said elements in electrical series.

References Cited by the Examiner

UNITED STATES PATENTS

| | | | |
|---|---|---|---|
| 1,818,437 | 8/1931 | Stuart | 136—4 |
| 1,848,655 | 3/1932 | Petrik | 136—4 |
| 2,229,481 | 1/1941 | Telkes | 136—5 |
| 2,626,970 | 1/1953 | Hunrath | 136— |
| 2,932,954 | 4/1960 | Evans | 136— |

FOREIGN PATENTS

| | | |
|---|---|---|
| 587,490 | 4/1947 | Great Britain. |

OTHER REFERENCES

Zhurnal Tekhnicheskoi Fiziki, vol. 26, No. 10, pages 2398–2399.

ALLEN B. CURTIS, *Primary Examiner.*

JOHN H. MACK, *Examiner.*